United States Patent
Fan

(10) Patent No.: US 7,851,990 B2
(45) Date of Patent: Dec. 14, 2010

(54) METHOD FOR GENERATING LOW COLOR TEMPERATURE LIGHT AND LIGHT EMITTING DEVICE ADOPTING THE SAME

(75) Inventor: Ben Fan, Heshan (CN)

(73) Assignee: He Shan Lide Electronic Enterprise Company Ltd., Heshan (CN)

( * ) Notice: Subject to any disclaimer, the term of this patent is extended or adjusted under 35 U.S.C. 154(b) by 454 days.

(21) Appl. No.: 11/851,139

(22) Filed: Sep. 6, 2007

(65) Prior Publication Data

US 2009/0066218 A1  Mar. 12, 2009

(51) Int. Cl.
- *H01J 1/62* (2006.01)
- *H01J 63/04* (2006.01)
- *C09K 11/66* (2006.01)
- *C09K 11/02* (2006.01)
- *C09K 11/77* (2006.01)

(52) U.S. Cl. .............. 313/503; 313/501; 313/512; 252/301.4 F; 252/301.4 R

(58) Field of Classification Search ......... 313/495–512; 252/301.4 F, 301.4 R
See application file for complete search history.

(56) References Cited

U.S. PATENT DOCUMENTS

| | | | |
|---|---|---|---|
| 6,069,440 A * | 5/2000 | Shimizu et al. ............ 313/486 |
| 6,294,800 B1 * | 9/2001 | Duggal et al. ............. 257/89 |
| 6,521,915 B2 * | 2/2003 | Odaki et al. .............. 257/98 |
| 6,903,506 B2 * | 6/2005 | Kita et al. ................ 313/506 |
| 7,129,638 B2 * | 10/2006 | Ng ........................ 313/512 |
| 7,560,859 B2 * | 7/2009 | Saito et al. .............. 313/498 |
| 7,573,190 B2 * | 8/2009 | Hirosaki et al. .......... 313/503 |
| 2002/0043926 A1 * | 4/2002 | Takahashi et al. ........ 313/503 |
| 2002/0175619 A1 * | 11/2002 | Kita et al. ............... 313/504 |
| 2003/0122482 A1 * | 7/2003 | Yamanaka et al. ........ 313/512 |
| 2006/0027785 A1 * | 2/2006 | Wang et al. ........... 252/301.4 F |
| 2006/0028122 A1 * | 2/2006 | Wang et al. ............. 313/503 |
| 2006/0145123 A1 * | 7/2006 | Li et al. ............... 252/301.4 F |
| 2007/0221925 A1 * | 9/2007 | Aliyev et al. ............ 257/79 |
| 2008/0029720 A1 * | 2/2008 | Li ....................... 250/581 |
| 2008/0111472 A1 * | 5/2008 | Liu et al. ............... 313/503 |

* cited by examiner

*Primary Examiner*—Sikha Roy
*Assistant Examiner*—Jose M Diaz
(74) *Attorney, Agent, or Firm*—Seyfarth Shaw LLP

(57) ABSTRACT

A method for generating low color temperature light and a light emitting device adopting the same, comprise a LED component, phosphor capable to be excited by the emission light of the LED component, and a package colloid for encapsulating the LED component and the phosphor, wherein the package colloid is provided with a electrode lead for connecting the LED component with the external power supply, the peak wavelength of emission light of the LED light is 460-500 nm, the peak wavelength of emission light of the excited phosphor is 580-630 nm. The present invention only use one chip and one kind of phosphor to generate the low color temperature light which is of the same effect as that of the minitype tungsten lamp or the high pressure sodium lamp, and is of advantages including energy saving, low cost and environmental protection, etc. The present invention can be widely used in the manufacturing process of LED lamp of low color temperature, especially in the manufacturing the mini LED bulb.

20 Claims, 6 Drawing Sheets

METHOD FOR GENERATING LOW COLOR TEMPERATURE LIGHT AND LIGHT EMITTING DEVICE ADOPTING THE SAME

BACKGROUND OF THE INVENTION

The present invention relates to a method for generating the light of LED lamp, in particular to a method for generating low color temperature light.

The present invention further relates to a light emitting device, in particular to a light emitting device for low color temperature light.

The simplest known LED may comprise a P-type semiconductor, a N-type semiconductor and a P-N junction between them. When the current travels through the LED, charge carriers (i.e. electron and hole) are generated in the P-N junction. Energy will be released in the form of photons as the electron and the cavity join together. Specified chemical materials may be added in the P-N junction so as to allow the light of specified color could be emitted by the LED lamp. For example, if InGaN is employed, the first wavelength light could be generated, and if GaN is employed, green light could be generated. The LED lamp is formed by encapsulating the LED with anode and cathode for connecting the power extending from the package colloid. Compared with the white light lamp such as minitype tungsten lamp and fluorescent lamp, the LED lamp is of the advantages including longer life time, energy saving, better reliability and durability, rapid reaction, less waste heat, adaptation to mass production, etc.

However, emission light with single wavelength of LED lamp can only be used in the specific decoration situation, and therefore a LED lamp with mixed colors used in various situations is the common object of the companies in this field. The method for generating such a LED lamp is to mix several kinds of single wavelength light so as to emit the desired color in different situations, such as white light, near-white light, amber light, etc, which is similar to color mixing on color palette to generate a specific color. In particular, the known methods for manufacturing the light mixing LED are mainly as follow:

1. LEDs of red, green and blue colors are encapsulated in one bulb, and an external circuit is provided for regulating the power of the tricolor LEDs. Thus, white light or near-white light could be obtained. In this structure, the powers of the three LEDs should be controlled separately, which results in the high complexity and costs for designing the peripheral circuit.

2. A LED emitting the first wavelength light (i.e. a blue LED) and a LED emitting the second wavelength light (i.e. a red LED) are used, and then the two LEDs are covered with yellow phosphor. After the light with the first wavelength irradiates on the yellow phosphor, one portion of the light travels through the yellow phosphor, while the rest of the light remains within the yellow phosphor to excite yellow light. The fist wavelength light (i.e. the blue light) and the second wavelength light (i.e. the red light) along with the yellow light are mixed together to generate white light or near-white light. In this structure, the desired voltage of the LED emitting the first wavelength light and that of the LED emitting the second wavelength light are very different, so that if the two LEDs are connected in series, high voltage is required, which is inconvenient for using, and if the two LEDs are connected in parallel, one of the two LEDs is required to be connected to a resistor, which increases the complexity of the manufacturing process and the costs of the LED lamp.

3. An ultraviolet LED is used. The ultraviolet radiation irradiates on the red, green and blue covering on the LED so as to generate red, green and blue light. The white light or near-white light is obtained by mixing by the red, green and blue light. However, a great amount of energy is released, when the ultraviolet radiation irradiates on the, which accelerates the aging of the phosphor and decreases the lifetime of the LED, and more seriously, hazardous substance is released after the ultraviolet radiation irradiates on the phosphor.

Moreover, the above methods are of the same problem that the emission light has a relatively high color temperature, and tends to be cold light which lacks of warm feeling as provided by the low color temperature light emitted from a minitype tungsten lamp or a high-pressure sodium lamp.

SUMMARY OF THE INVENTION

It is an object of the present invention to provide a method for generating low color temperature light, in which the warm light with low color temperature is provided, and the method can be implemented by devices with low costs, energy saving and long lifetime.

The above object of the present invention is achieved by the following technical solutions:

A method for generating low color temperature light, comprising the following steps:

a) the first wavelength light with a peak wavelength ranging from 460 to 500 nm is emitted by a LED component;

b) a portion of the first wavelength light is absorbed by phosphor so as to inspire the second wavelength light with a peak wavelength ranging from 580 to 630 nm; and c) the rest of the first wavelength light that was not absorbed is mixed with the second wavelength light so as to generate the low color temperature light.

It is another object of the present invention to provide a light emitting device for low color temperature light using the above-described method.

The above-mentioned another object of the present invention is achieved by the following technical solutions:

A light emitting device for low color temperature light comprises:

a package colloid being as a casing; an electrode lead, the electrode lead being provided inside the package colloid; a LED component, the LED component being mounted on the electrode lead and covered with the phosphor that is capable to be excited by the emission light of the LED component; wherein the peak wavelength of emission light of the LED component ranges from 460 to 500 nm, the peak wavelength of emission light of the excited phosphor ranges from 580 to 630 nm.

The following table shows the test results of the device according to the present invention and the minitype tungsten lamp:

| sample | Testing contents | | |
| --- | --- | --- | --- |
| | The coordinate scope on the CIE Chromaticity Diagram | Color Temperature (Kelvin) | Light Efficiency (lm/w) |
| The light emitting device of the present invention | (0.43, 1.33), (0.43, 0.38), (0.54, 0.33), (0.54, 0.44) | 1600-2500 | about 24 |
| Minitype tungsten lamp | (0.54, 0.41), (0.55, 0.42), (0.55, 0.41), (0.54, 0.42) | 1800-2300 | about 2.5 |

As seen from the above table, the coordinates on the CIE Chromaticity Diagram and the color temperature of the mixed light of the present invention is very close to that of the minitype tungsten lamp. However, the light efficiency of the present invention is nearly 10 times higher than that of the minitype tungsten lamp. Moreover, compared with the LED lamp using three chips, the present invention only use one LED component, which saves the costs and simplifies the control circuit. The peak wavelength of emission light of the LED component ranges from 460 to 500 nm. The released energy is relatively low, the easy aging of the phosphor can be avoided, and hazardous substances will not be released, which is healthy and environmental-friendly.

In conclusion, the present invention is of the advantages including low color temperature, low costs, energy saving, environmental protection, long lifetime, etc.

Furthermore, the present invention could be further improved with the following technical solutions:

The peak wavelength of emission light of the LED component ranges from 470 to 480 nm, the peak wavelength of emission light of the excited phosphor is 600±3 nm. As indicated in the test, with the LED component and the phosphor having these parameters, the color temperature of the generated low color temperature light is 1900K-2100K, and the chromaticity coordinates of the low color temperature light is within an area defined by the following points having coordinates on the CIE Chromaticity Diagram: (0.48, 0.39), (0.48, 0.43), (0.53, 0.44), (0.53, 0.41).

The peak wavelength of emission light of the LED component ranges from 480 to 490 nm, the peak wavelength of emission light of the excited phosphor is 610±3 nm. As indicated in the test, with the LED component and the phosphor having these parameters, the color temperature of the generated low color temperature light is 1900K-2100K, and the chromaticity coordinates of the low color temperature light is within an area defined by the following points having coordinates on the CIE Chromaticity Diagram: (0.48, 0.39), (0.48, 0.43), (0.53, 0.44), (0.53, 0.41).

The peak wavelength of emission light of the LED component ranges from 470 to 480 nm, the peak wavelength of emission light of the excited phosphor is 590±3 nm. As indicated in the test, with the LED component and the phosphor having these parameters, the color temperature of the generated low color temperature light is 2100K-2300K, and the chromaticity coordinates of the low color temperature light is within an area defined by the following points having coordinates on the CIE Chromaticity Diagram: (0.48, 0.39), (0.48, 0.43), (0.53, 0.44), (0.53, 0.41).

The LED component emits light having a peak emission wavelength ranging from 460-470 nm, excited the light emitted by the phosphor has an excited peak emission wavelength of 590±3 nm. Testing shows, with the LED component and the phosphor having these parameters, the color temperature of the generated low color temperature light is 2100K-2300K, and the chromaticity coordinates of the low color temperature light is within an area defined by the following points having coordinates on the CIE Chromaticity Diagram chromaticity diagram: (0.48, 0.39), (0.48, 0.43), (0.53, 0.44), (0.53, 0.41).

The peak wavelength of emission light of the LED component ranges from 460 to 470 nm, and the peak wavelength of emission light of the excited phosphor is 590±3 nm. As indicated in the test, with the LED and the phosphor having these parameters, the color temperature of the generated low color temperature light is around 2100K, and the chromaticity coordinates of the low color temperature light is within an area defined by the following points having coordinates on the CIE Chromaticity Diagram: (0.43, 0.36), (0.43, 0.44), (0.51, 0.40), (0.51, 0.34).

Inside the package colloid there is a cup where the LED component is installed on so that the LED component is fixed firmly before encapsulation and will facilitate the encapsulating process and enhance the capability of mass production.

The inner wall of the cup element forms a light condenser, so that light beams can be emitted in one direction.

The phosphor concentrates in the cup to cover the LED component so that the dosage can be economized.

BRIEF DESCRIPTION OF THE DRAWING

The structural and operational characteristics of the present invention and its advantages as compared to the known state of the prior art will be better understood from the following description, relating to the attached drawings which show illustratively but not restrictively an example of a pot with improved configuration. In the drawings.

DETAILED DESCRIPTION OF THE INVENTION

Figure 1:
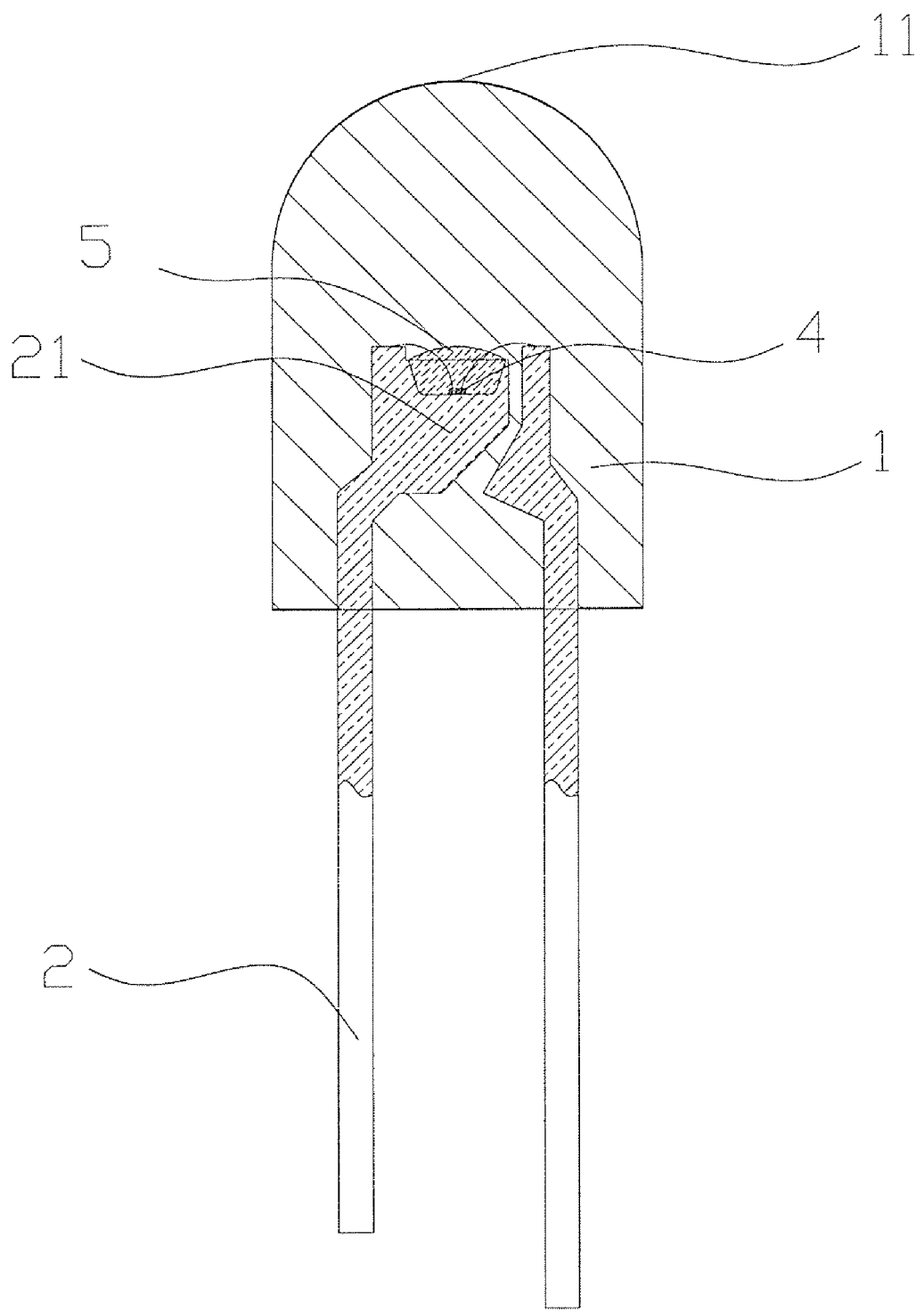
FIG. 1 is a first schematic structural view of the light emitting device according to an embodiment of the present invention.
Figure 2:
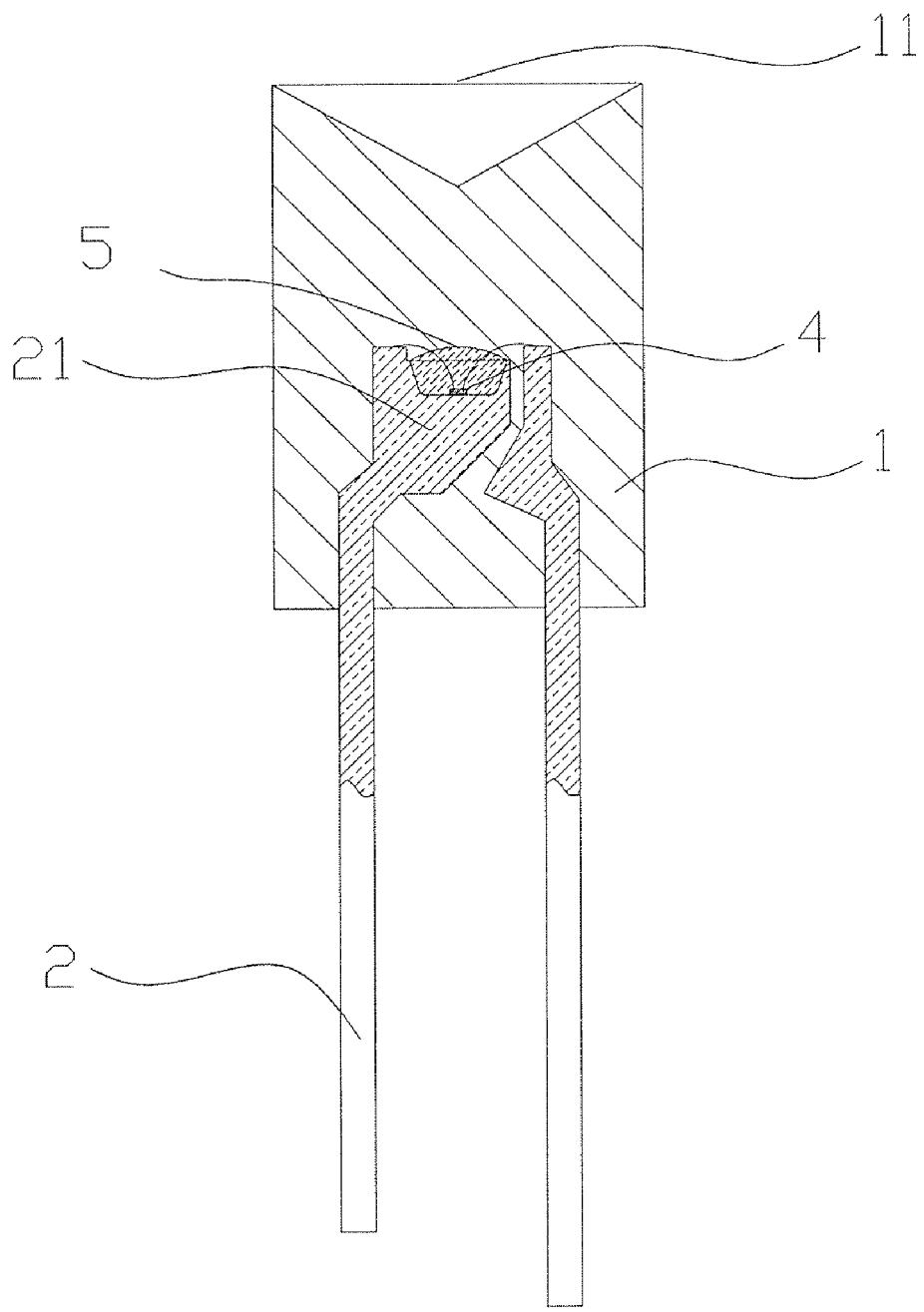
FIG. 2 is a second schematic structural view of the light emitting device according to an embodiment of the present invention.
Figure 5:
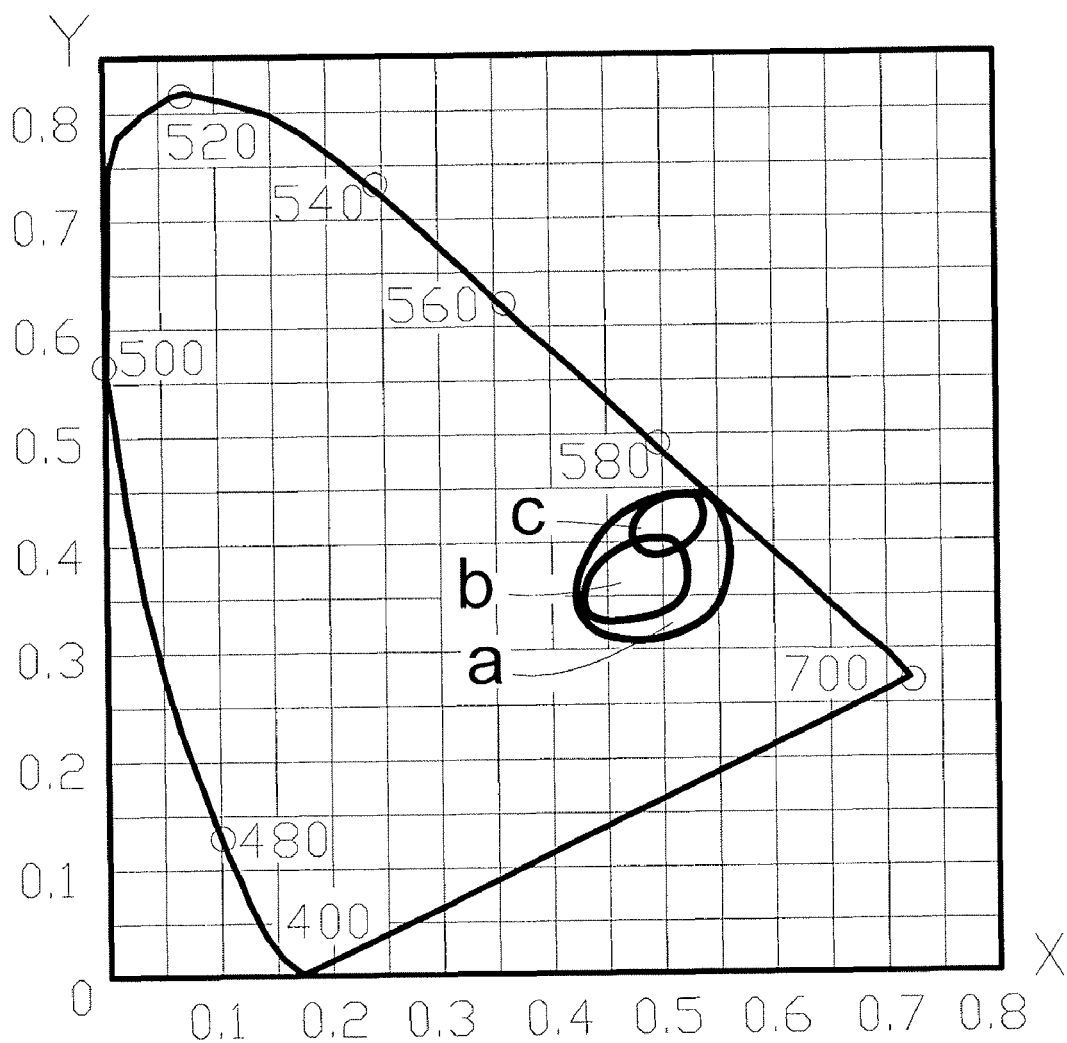
FIG. 5 is a diagram showing positions of the warm white light emitted by the light emitting device according to an embodiment of the present invention.
Figure 6:
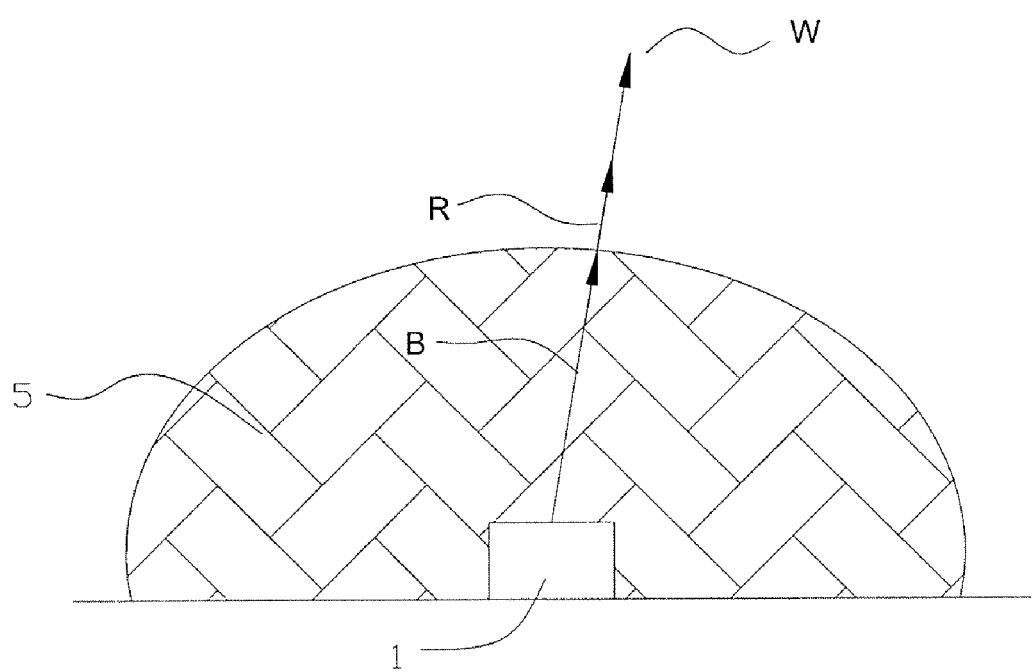
FIG. 6 is a schematic structural view showing the light mixing process of the light emitting device according to an embodiment of the present invention.

Referring to FIG. 1, a light emitting device for low color temperature light includes a casing being formed of a package colloid 1 of epoxy resin or other plastic materials. The package colloid 1 is provided with a LED component 4 inside. The LED component 4 is supported and connected to the external power supply by an electrode lead 2. The first wavelength light B is emitted by the LED component 4 with the peak wavelength ranging from 460 nm to 500 nm. The LED component 4 is covered by the phosphor 5 represented by the general formula $A_2SiO_4:Eu^{2+}$, D, wherein A is one of the elements selecting from the group consisting of Sr, Ca, Mg, Zn, Cd and I, D is one of the elements selecting from the group consisting of F, Cl, Br, I, P, S and N. The phosphor 5 can absorb a portion of the first wavelength light B and can be excited to generate the second wavelength light R with the peak wavelength ranging from 590-630 nm. After the electrode lead 2 is connected to the power supply, the LED component emits the first wavelength light B, one portion of which travels through the phosphor 5, and another portion is absorbed by the phosphor 5 to generate the second wavelength light R. The second wavelength light R is mixed with the first wavelength light B that is not absorbed by the phosphor 5, so as to generate the low color temperature light W. The principle of light mixing is shown in FIG. 6. As indicated in the test, by using the above-mentioned technical solution, the chromaticity coordinates of the low color temperature light emitted by the LED component is mainly within an area defined by the following points having coordinates on the CIE Chromaticity Diagram: (0.43, 0.33), (0.43, 0.38), (0.54, 0.33), (0.54, 0.44), as shown in "a" section of FIG. 5, and the color temperature is about 1600K-2500K. The mixed light within this area is a low color temperature light with a little jacinth, which gives people warm feelings and especially adapted for situations where the warm color is required, such as household or street lamp.

Among the LED components 4 and the phosphor 5 having the above-mentioned scope of wavelength, different LED component 4 emitting light with different peak wavelength can be selected, in cooperation with different phosphor 5, to generate low color temperature light with different colors and color temperature.

For example, when the peak wavelength of emission light of LED component 4 is 470-480 nm and the peak wavelength of emission light of the excited phosphor 5 is 600±3 nm, the obtained low color temperature light is of the color temperature ranging from 1900K to 2100K, and the chromaticity coordinates of the lower color temperature is within an area defined by the following points having coordinates on the CIE Chromaticity Diagram: (0.48, 0.39), (0.48, 0.43), (0.53, 0.44), (0.53, 0.41), as shown in "c" section of FIG. 5. The light color within this area will appear the color of a mini LED bulb which is especially suitable for manufacture of duralight to replace the existed minitype tungsten lamp having a mini LED bulb color. If the peak wavelength of emission light of LED component 4 is ranging from 480-490 nm and the peak wavelength of emission light of the excited phosphor 5 is 610±3 nm, the obtained low color temperature light is of the color temperature ranging from 1900K to 2100K and locates within the coordinate scope on the CIE Chromaticity Diagram: (0.48, 0.39), (0.48, 0.43), (0.53, 0.44), (0.53, 0.41), as shown in "c" section of FIG. 5. The light color within this area will appear the color of a mini LED bulb which is especially suitable for manufacture of duralight to replace the existed minitype tungsten lamp having a mini LED bulb color.

If the peak wavelength of emission light of LED component 4 is 470-480 nm and the peak wavelength of emission light of the excited phosphor 5 is 590±3 nm, the obtained low color temperature light is of the color temperature ranging from 2100K to 2300K and locates within the coordinate scope on the CIE Chromaticity Diagram: (0.48, 0.39), (0.48, 0.43), (0.53, 0.44), (0.53, 0.41), as shown in "c" section of FIG. 5. The light color in this section is champagne, which is especially adapted for the duralight to replace the known minitype tungsten lamp with champagne light color.

If the peak wavelength of emission light of LED component 4 is 480-495 nm and the peak wavelength of emission light of the excited phosphor 5 is 600±3 nm, the obtained low color temperature light is of the color temperature ranging from 2100K to 2300K and locates within the coordinate scope on the CIE Chromaticity Diagram: (0.48, 0.39), (0.48, 0.43), (0.53, 0.44), (0.53, 0.41), as shown in "c" section of FIG. 5. The light color in this section is champagne, which is especially adapted for the duralight to replace the known minitype tungsten lamp with champagne light color.

If the peak wavelength of emission light of LED 4 is 460-470 nm and the peak wavelength of emission light of the excited phosphor 5 is 590±3 nm, the obtained low color temperature light is of the color temperature being about 2100K, and the chromaticity coordinates of the lower color temperature is within an area defined by the following coordinates on the CIE Chromaticity Diagram: (0.43, 0.36), (0.43, 0.34), (0.51, 0.40), (0.51, 0.34), as shown in "b" section of FIG. 5. The light color temperature in this section is similar to that of high pressure sodium lamp (about 2000K), which is especially adapted for street lamp to replace the known high pressure sodium lamp.

The above coordinate scope of the light on CIE Chromaticity Diagram is obtained from testing a plurality of samples by optical spectrum analyzer. Considering the discreteness of the numerical value and other factors to the light color during the manufacturing process, the coordinate scope is defined by the centralized and representative test results and thus is not strictly absolute, so that it is possible that some of the test results may fall outside the above coordinate scope of light on CIE Chromaticity Diagram.

The LED component 4 may be directly connected to the electrode lead 2 and then encapsulated by colloid such as epoxy resin. Alternatively, the LED 4 may be disposed inside a cup element 21 which is on the top of the electrode lead 2 and obtained by punching or welding, wherein the LED component 4 is connected to the electrode lead 2 by wire, which will increase the integration of the electrode lead 2 and the LED component 4 so as to protect the LED component 4.

The cup 21 may be designed to be trumpet-shaped and provided with reflection material on the inner wall. Alternatively, the inner wall of the cup element 21 may be polished to be of reflection ability. Therefore, the cup element 21 forms a light condenser, and thus the light can be emitted in one direction.

Figure 4:
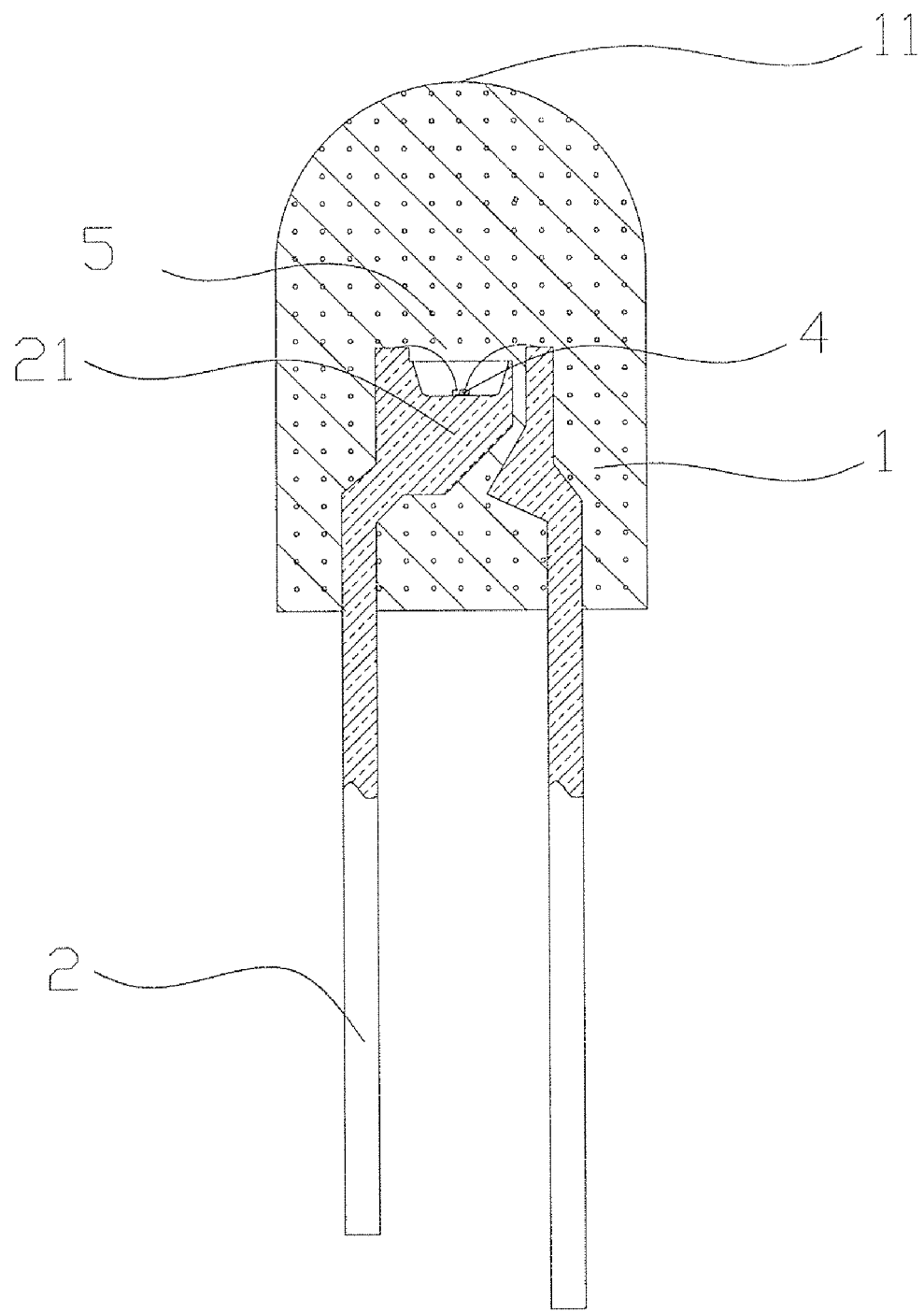
FIG. 4 is a fourth schematic structural view of the light emitting device according to an embodiment of the present invention.

After the LED component 4 is disposed in the cup 21, the phosphor 5 is injected into the cup 21 so as to cover the LED component 4, and then encapsulating is carried out. Alternatively, the phosphor 5 may be mixed into the encapsulating glue solution in advance, and when the LED 4 and the electrode lead 2 are encapsulated, the phosphor 5 will be distributed in the package colloid 1 which covers the LED component 4, as shown in FIG. 4.

Figure 3:
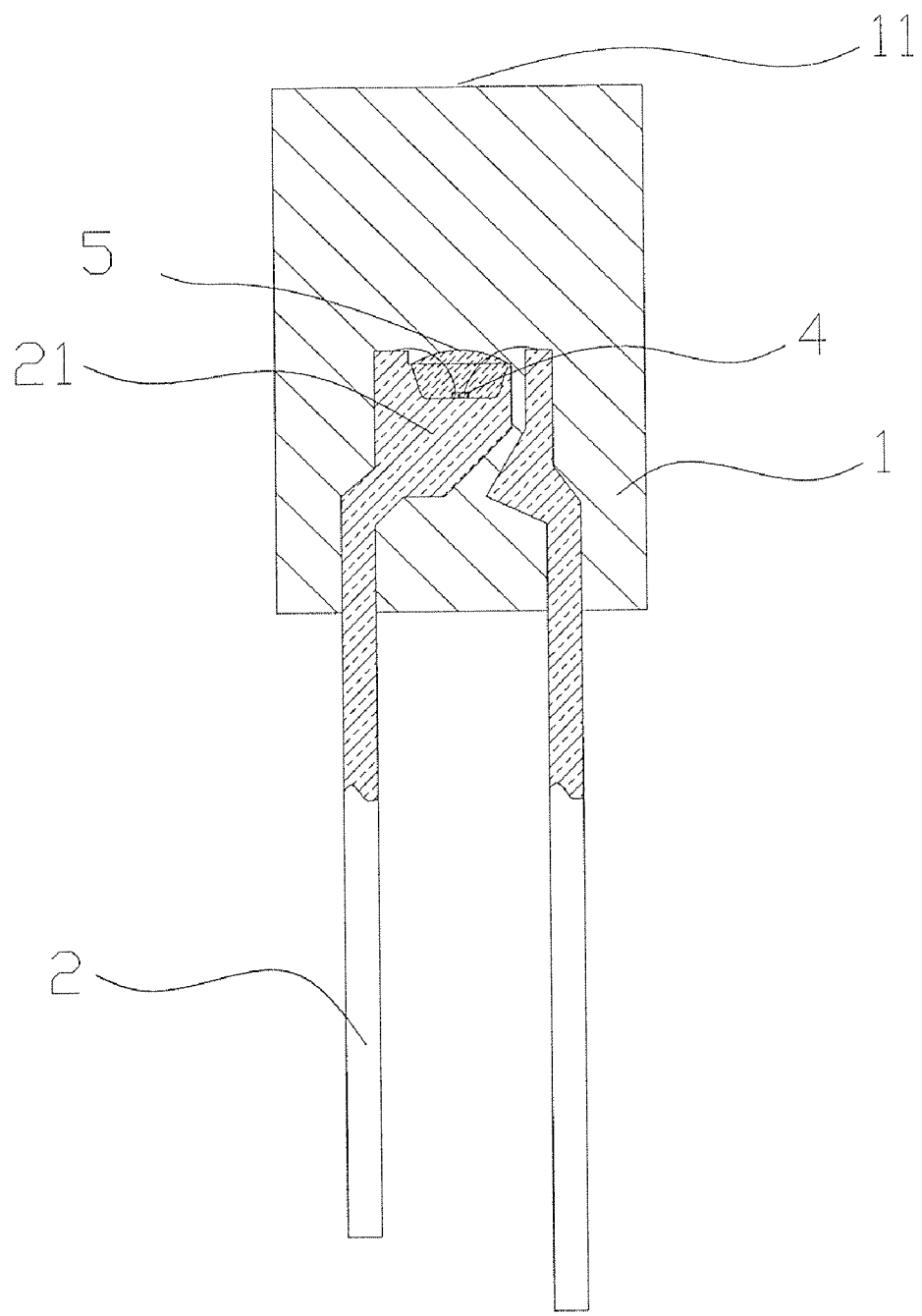
FIG. 3 is a third schematic structural view of the light emitting device according to an embodiment of the present invention.

Furthermore, different direction of the emission light may be obtained by changing the structure of the top 11 of package colloid 1. For example, as shown in FIG. 1, the top 11 of package colloid 1 may be designed to be circular arc shaped, so that parallel light can be obtained after the light emitted by spot light source in the package colloid 1 is reflected by the top 11 of circular arc shape. As shown in FIG. 3, the top 11 of package colloid 1 may be designed to be recess-shaped, diffuse light can be obtained after the light emitted by spot light source in the package colloid 1 is reflected by the top 11 of recess shape. As shown in FIG. 4, the top 11 of package colloid 1 may be designed to be flat, emanative light in a certain degree can be obtained after the light emitted by spot light source in the package colloid 1 is refracted by the flat top 11.

What is claimed is:

1. A method for generating low color temperature light, comprising the following steps:
    illuminating a LED component to emit the first wavelength light (B) having an emission peak ranging from 460 nm to 500 nm;
    exciting a phosphor that absorbs a part of the first wavelength light (B) to emit the second wavelength light (R) having an emission peak ranging from 580 nm to 630 nm, wherein the phosphor is represented by the general formula $I_2SIO_4:Eu^{2+}$, D; D is one of the elements selecting from the group consisting of F, Cl, Br, I, P, S and N; and
    mixing the first wavelength light (B) with the second wavelength light (R) to generate a low color temperature warm light (W).

2. The method for generating low color temperature light of claim 1, wherein the peak wavelength of the first wavelength light ranges from 470 to 480 nm, the peak wavelength of the second wavelength light is 600±3 nm.

3. The method for generating low color temperature light of claim 1, wherein the peak wavelength of the first wavelength light ranges from 480 to 490 nm, the peak wavelength of the second wavelength light is 610±3 nm.

4. The method for generating low color temperature light of claim 1, wherein the peak wavelength of the first wavelength light ranges from 470 to 480 nm, the peak wavelength of the second wavelength light is 590±3 nm.

5. The method for generating low color temperature light of claim 1, wherein the peak wavelength of the first wavelength light ranges from 480 to 495 nm, the peak wavelength of the second wavelength light is 600±3 nm.

6. The method for generating low color temperature light of claim 1, wherein the peak wavelength of the first wavelength light ranges form 460 to 470 nm, the peak wavelength of the second wavelength light is 590±3 nm.

7. A light emitting device for low color temperature light using the method of claim 1, comprising:
 a package colloid being as a casing;
 an electrode lead being provided inside the package colloid;
 a LED component, the LED component being mounted on the electrode lead and covered with the phosphor that is capable to be excited by the emission light of the LED component, wherein the phosphor is represented by the general formula $I_2SiO_4:Eu^{2+}$, D; D is one of the elements including F, Cl, Br, I, P, S and N;
 wherein the peak wavelength of emission light of the LED component ranges from 460 to 500 nm, the peak wavelength of emission light of the excited phosphor ranges from 580 to 630 nm.

8. The light emitting device for low color temperature light of claim 7, wherein the peak wavelength of emission light of the LED component ranges from 470 to 480 nm, the peak wavelength of emission light of the excited phosphor is 600±3 nm.

9. The light emitting device for low color temperature light of claim 7, wherein the peak wavelength of emission light of the LED component ranges from 480 to 490 nm, the peak wavelength of emission light of the excited phosphor is 610±3 nm.

10. The light emitting device for low color temperature light of claim 7, wherein the peak wavelength of emission light of the LED component ranges from 470 to 480 nm the peak wavelength of emission light of the excited phosphor is 590±3 nm.

11. The light emitting device for low color temperature light of claim 7, wherein the peak wavelength of emission light of the LED component ranges from 480 to 495 nm the peak wavelength of emission light of the excited phosphor is 600±3 nm.

12. The light emitting device for low color temperature light of claim 7, wherein the peak wavelength of emission light of the LED component ranges from 460 to 470 nm the peak wavelength of emission light of the excited phosphor is 590±3 nm.

13. The light emitting device for low color temperature light of claim 7, wherein the electrode lead is provided with a cup element, the LED component is disposed inside the cup element.

14. The light emitting device for low color temperature light of claim 13, wherein the cup element is integrated with the electrode lead.

15. The light emitting device for low color temperature light of claim 13, wherein the inner wall of the cup element forms a light condenser.

16. The light emitting device for low color temperature light of claim 13, wherein the phosphor is concentrated inside the cup element and covers the LED component.

17. The light emitting device for low color temperature light of claim 7, wherein the phosphor is mixed within the package colloid.

18. The light emitting device for low color temperature light of claim 7, wherein the top of the package colloid is of a shape of arched protrusion, tapered recess or flat.

19. The light emitting device for low color temperature light of claim 16, wherein the top of the package colloid is of a shape of arched protrusion, tapered recess or flat.

20. The light emitting device for low color temperature light of claim 17, wherein the top of the package colloid is of a shape of arched protrusion, tapered recess or flat.

\* \* \* \* \*